US009413315B2

(12) United States Patent
Fang et al.

(10) Patent No.: US 9,413,315 B2
(45) Date of Patent: Aug. 9, 2016

(54) LOW NOISE AMPLIFIER WITH EMBEDDED FILTER AND RELATED WIRELESS COMMUNICATION UNIT

(75) Inventors: Sher Jiun Fang, Allen, TX (US); Khurram Muhammad, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1934 days.

(21) Appl. No.: 11/469,298

(22) Filed: Aug. 31, 2006

(65) Prior Publication Data

US 2008/0079497 A1   Apr. 3, 2008

(51) Int. Cl.
| | |
|---|---|
| *H04B 1/16* | (2006.01) |
| *H03F 3/45* | (2006.01) |
| *H03F 1/22* | (2006.01) |
| *H03F 1/56* | (2006.01) |
| *H03F 3/193* | (2006.01) |

(52) U.S. Cl.
CPC ............ *H03F 3/45188* (2013.01); *H03F 1/223* (2013.01); *H03F 1/56* (2013.01); *H03F 3/193* (2013.01)

(58) Field of Classification Search
CPC ..... H03F 3/45188; H03F 3/193; H03F 1/223; H03F 1/56
USPC ........ 455/115.1, 126, 130, 226.1, 296, 67.11, 455/341, 114.2, 293
See application file for complete search history.

(56) References Cited

U.S. PATENT DOCUMENTS

| | | | |
|---|---|---|---|
| 4,263,676 A | 4/1981 | Liebel | |
| 6,038,460 A | 3/2000 | Aleiner | |
| 6,642,781 B1 | 11/2003 | Eker et al. | |
| 6,681,103 B1 * | 1/2004 | Rogers et al. | ................. 455/302 |
| 6,944,435 B2 * | 9/2005 | Contopanagos et al. | ...... 455/307 |
| 7,583,166 B2 * | 9/2009 | Lin et al. | ....................... 333/213 |
| 2001/0041548 A1 | 11/2001 | Bult et al. | |

OTHER PUBLICATIONS

Bode PLot, Wikipedia, the free encyclopedia, retrieved from Internet on Feb. 28, 2011.*
LC circuit, Wikipedia, the free encyclopedia, retrieved from Internet on Feb. 28, 2011.*

* cited by examiner

*Primary Examiner* — Duc M Nguyen
(74) *Attorney, Agent, or Firm* — Ronald O. Neerings; Frank D. Cimino

(57) ABSTRACT

In one embodiment, a WCDMA FDD system includes an embedded filter that provides a complex load to transistors in a low noise amplifier. The complex load can be constructed using passive and/or active devices and creates an arbitrary transfer function that supports selective Q-enhancement of poles or zeros. One particular implementation of the embedded filter is in the form of an LC tank circuit. The LC tank circuit is operably coupled to the output of the low noise amplifier and creates a transfer function whose poles and zeros can be selected to reject transmitter leakage in the WCDMA system, while maintain a desirable gain at the frequency of operation.

9 Claims, 5 Drawing Sheets

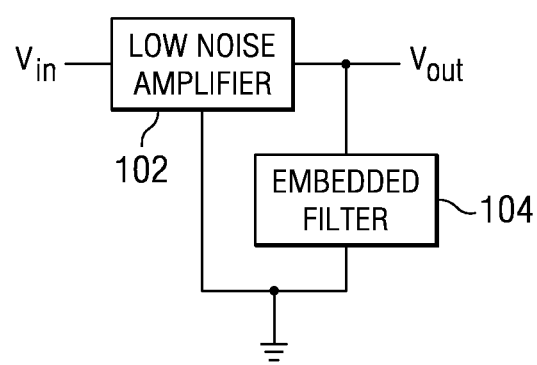
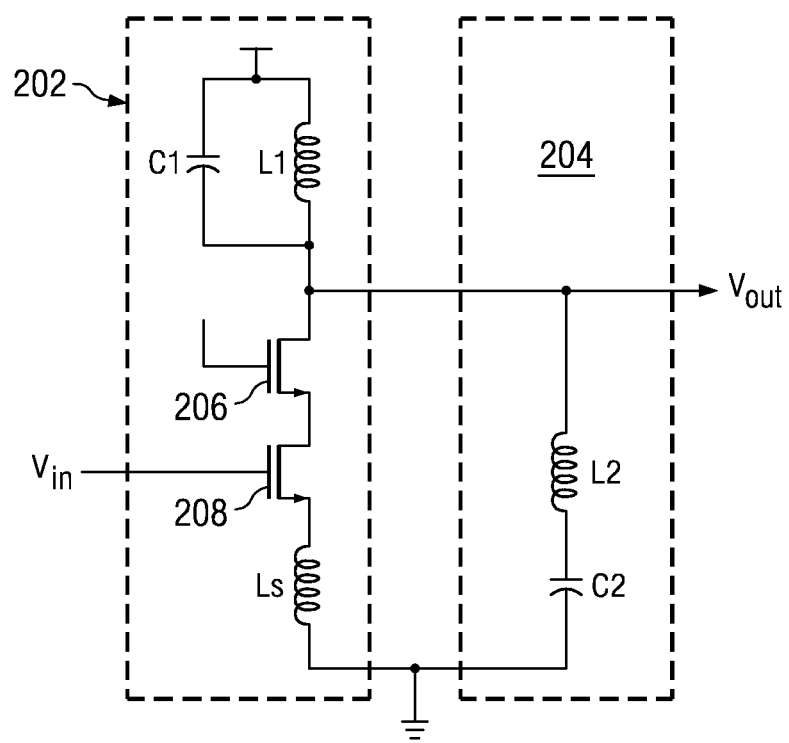

LOW NOISE AMPLIFIER WITH EMBEDDED FILTER AND RELATED WIRELESS COMMUNICATION UNIT

BACKGROUND

Wideband Code Division Multiple Access (WCDMA) is one of the main technologies for implementation of $3^{rd}$ generation cellular systems. WCDMA can use Frequency Division Duplex (FDD) as its duplexing technique in connection with its data transmission activities. In these types of systems, WCDMA FDD typically operates with both a receiver and a transmitter that are active at the same time.

An external duplexer filter is typically used in FDD systems. Yet, power levels associated with transmitter leakage at the receiver input can still run undesirably high, e.g. between −30 to −20 dBm. Transmitter leakage that is present at the receiver's front end sets high linearity requirements for the system's mixer In the past, to relax the mixer's linearity requirements, an external SAW filter has been used. Typically, this external SAW filter is placed between the system's low noise amplifier (LNA) and the mixer.

Using an external SAW filter in this capacity, however, has several drawbacks. For example, its insertion loss degrades the noise figure of the receiver. In addition, the SAW filter requires the LNA to have a 50 Ohm output matched, which requires additional matching circuitry. Further, using a SAW filter reduces the level of integration of the receiver, as will be appreciated by the skilled artisan.

SUMMARY

In one embodiment, a WCDMA FDD system includes an embedded filter that provides a complex load to transistors in a low noise amplifier. The complex load can be constructed using passive and/or active devices and creates an arbitrary transfer function that supports selective Q-enhancement of poles or zeros. One particular implementation of the embedded filter is in the form of an LC tank circuit. The LC tank circuit is operably coupled to the output of the low noise amplifier and creates a transfer function whose poles and zeros can be selected to reject transmitter leakage in the WCDMA system, while maintain a desirable gain at the frequency of operation.

In one embodiment, the embedded filter can employ wire bond inductors. In other embodiments, the embedded filter can employ on-chip spiral inductors. In embodiments that utilize on-chip spiral inductors, various Q-enhancement techniques can be utilized to provide a negative resistor. For example, in at least some embodiments, a negative resistor can be provided by using a pair of cross-coupled field effect transistors. In yet other embodiments, a negative resistor can be provided by utilizing coupled inductors.

BRIEF DESCRIPTION OF THE CONTENTS

FIG. 1 illustrates an exemplary high level diagram of a circuit in accordance with one embodiment.

FIG. 2 illustrates an exemplary circuit in accordance with one embodiment.

DETAILED DESCRIPTION

Figure 3:
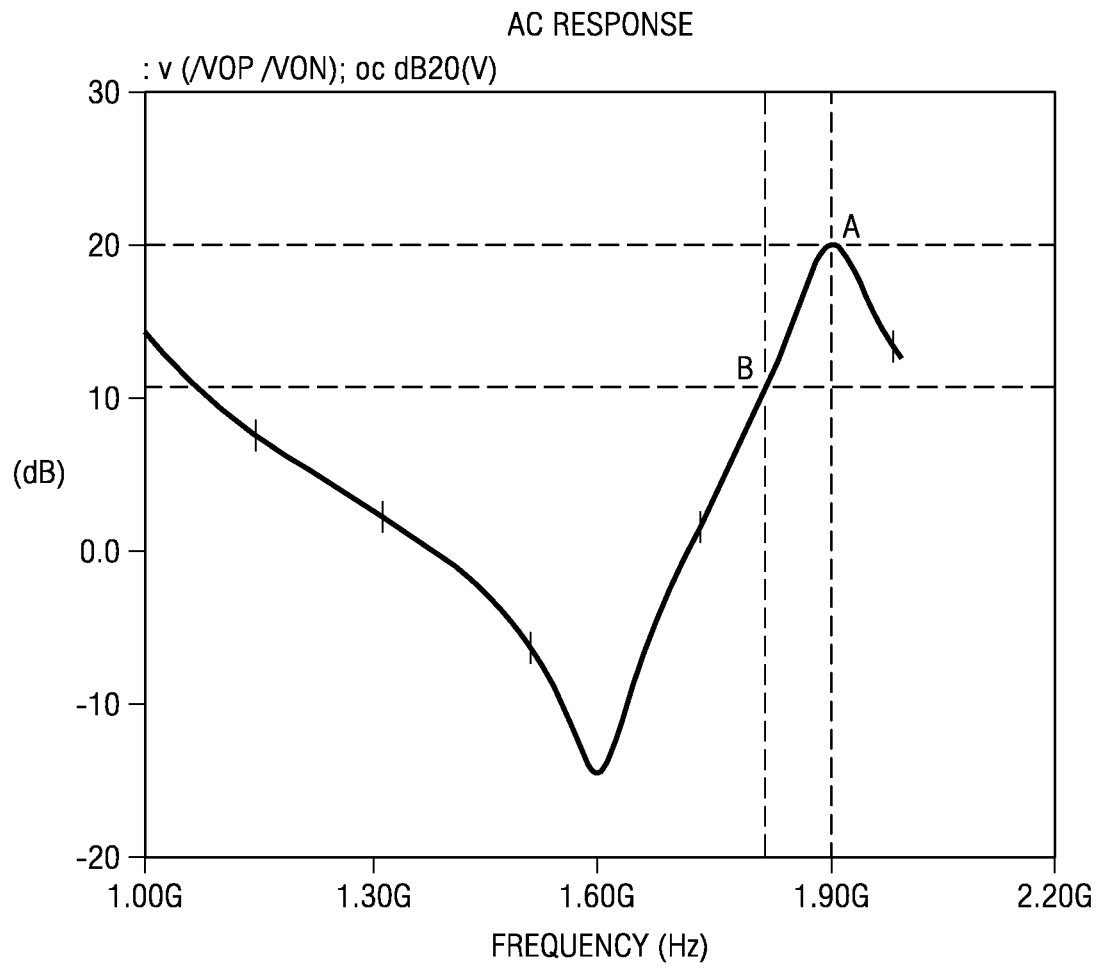
FIG. 3 illustrates the frequency response of the circuit of FIG. 2.

Overview various embodiments can eliminate the use of an external saw filter by utilizing a low noise amplifier with an embedded filter that can filter out unwanted blockers or images. In accordance with at least some embodiments, the embedded filter is configured to and provides a complex load to transistors in the low noise amplifier. The complex load can be constructed using passive and/or active devices and creates an arbitrary transfer function that supports selective Q-enhancement of poles or zeros. In accordance with at least some embodiments, the low noise amplifier employs an embedded filter in the form of an LC tank circuit at the output of the tuned low noise amplifier to create a new transfer function. The new transfer function presents a complex load to the low noise amplifier. In at least some embodiments, the complex load has three zeros and four poles. By properly placing the poles and zeros, the impedance at the transmitter frequency is desirably low, while the impedance is desirably high at the operating frequency. This, in turn, provides for selective amplification of the desired signals and selective rejection of the undesired signals.

FIG. 1 illustrates an exemplary high level diagram of a circuit in accordance with one embodiment, generally at 100. In this example, circuit 100 includes a low noise amplifier 102 coupled to receive an input signal vin which constitutes the input signal for a receiver of a WCDMA system receiver. Low noise amplifier 102 includes an amplified output vout which, in this embodiment, is coupled to an embedded filter 104. In the illustrated and described embodiment, the embedded filter is configured to provide a complex load to transistors in low noise amplifier 102. The complex load can be constructed using passive and/or active devices and creates an arbitrary transfer function that supports selective Q-enhancement of poles or zeros. Any suitable embedded filter that provides a complex load can be utilized. In the illustrated and described embodiment, an embedded filter in the form of an LC tank circuit is provided. It is to be appreciated and understood that other complex-load providing circuits can be utilized without departing from the spirit and scope of the claimed subject matter.

In addition, any suitable low noise amplifier and LC tank circuit can be utilized. Specific, non-limiting examples are provided just below. It is to be appreciated and understood that the examples provided just below are not intended to limit application of the claimed subject matter to these specific examples. Rather, low noise amplifiers and LC tank circuits other than those specifically illustrated and described herein can be utilized without departing from the spirit and scope of the claimed subject matter.

As noted above, the LC tank circuit provides a complex load whose impedance at the transmitter frequency is desirably low, while being desirably high at the operating frequency. This, in turn, provides for selective amplification of the desired signals and selective rejection of the undesired signals.

Exemplary Low Noise Amplifier Employing Bond Wire Inductors

FIG. 2 illustrates an exemplary circuit in accordance with one embodiment, generally at 200. In this example, circuit 200 is a single ended version that includes a low noise amplifier 202 whose output load is changed by an additional LC tank circuit 204. This circuit could be implemented as a double ended version, such as those that are described below.

In this example, low noise amplifier 202 includes a pair of field effect transistors 206, 208. Transistor 206 is coupled to a parallel connection of capacitor C1 and inductor L1. Transistor 208 has its gate connected to vin, which is the input signal for a receiver of a WCDMA system receiver. Transistor 208 is connected to ground through an inductor Ls which is used for tuning amplifier 202, as will be appreciated by the skilled artisan.

LC tank circuit 204 includes, in this example, an inductor L2 and a capacitor C2, connected between the amplified output vout and ground.

In this embodiment, the inductors of circuit 200 are implemented as bond wire inductors. In this embodiment, the bond wire inductors have a typical quality factor (Q) of 25. With this Q factor low noise amplifier 202 achieves 9 dB of rejection at 80 MHz offset frequency from an operating frequency of 1900 MHz.

FIG. 3 illustrates the frequency response of the circuit of FIG. 2. As indicated, circuit 200 has a gain of 20 dB (indicated at A). A comparison chart is shown in Table 1 below and compares the operating parameters of the FIG. 2 circuit with the operating parameters of a conventional tuned low noise amplifier without the LC tank circuit.

TABLE 1

| Operating Parameter | Conventional Tuned Low Noise Amplifier | Low Noise Amplifier with LC Tank Circuit (Lprim = 3 nH, fos = 300 MHz) |
|---|---|---|
| Gain | 25.6 dB | 20.1 dB |
| Transmitter Rejection | 5.1 dB | 9.0 dB |
| Noise Factor | 1.37 | 1.54 dB |
| IIP3 | 2.7 | 2.6 dB |

Notice here that the transmitter rejection for the circuit with the LC tank circuit is down an additional 4 dB, without a very small penalty in the noise factor. In this example, the rejection can be further increased by using higher Q bond wires.

Exemplary Low Noise Amplifier Employing On-Chip Spiral Inductors

Figure 4:
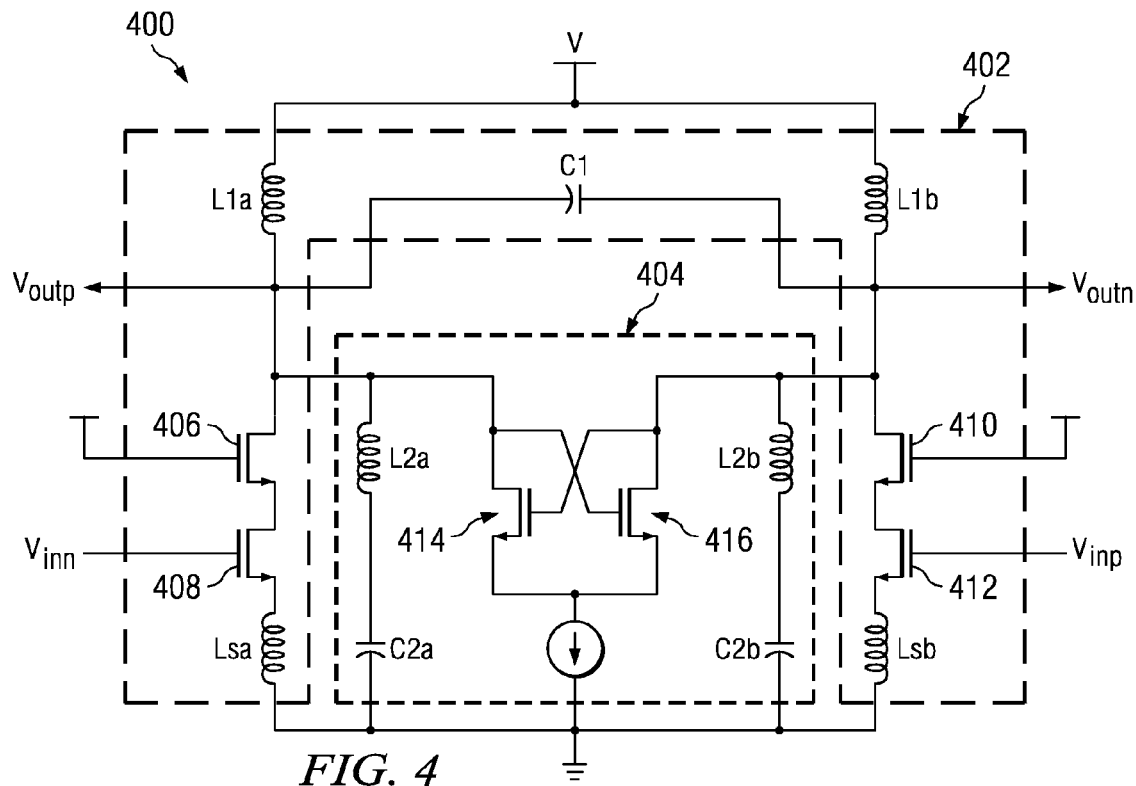
FIG. 4 illustrates an exemplary circuit in accordance with one embodiment.

FIG. 4 illustrates an exemplary circuit in accordance with one embodiment, generally at 400. In this example, circuit 400 is a double ended version that includes a low noise amplifier 402 whose output is coupled to an LC tank circuit 404.

In this example, a first end of the low noise amplifier 402 includes a pair of field effect transistors 406, 408. Transistor 406 is connected between output voutp and transistor 408 which has its gate connected to vinn. Here, vinn and voutp represent, respectively, the negative portion of the input signal for a receiver of a WCDMA system receiver and the amplified positive portion of the output signal for the WCDMA system. Transistor 406 is also connected to an inductor L1a which is tied to supply voltage V. Transistor 408 is connected to ground through an inductor Lsa which is used to tune the amplifier.

A second end of the low noise amplifier 402 includes a pair of field effect transistors 410, 412. Transistor 410 is connected between output voutn and transistor 412 which has its gate connected to vinp. Here, vinp and voutn represent, respectively, the positive portion of the input signal for a receiver of a WCDMA system receiver and the amplified negative portion of the output signal for the WCDMA system. Transistor 410 is also connected to an inductor L1b which is tied to voltage V. Transistor 412 is connected to ground through an inductor Lsb which is used to tune the amplifier.

In this embodiment, a capacitor C1 is connected between the negative and positive portions of the amplified output signal.

In addition, LC tank circuit 404 is connected between the output of the low noise amplifier 402 and ground. In this example, the LC tank circuit includes a pair of on-chip spiral inductors L2a and L2b, each of which is serially connected to a capacitor C2a, C2b respectively. Each capacitor is connected to ground. In this embodiment, the Q of the on-chip spiral inductor is low in comparison to where it should desirably occur.

To address this situation, the circuit is Q-enhanced by virtue of a pair of cross-coupled field effect transistors 414, 416. Here, the cross-coupled field effect transistors are connected between the amplified output voutp, voutn and ground, and across the individual LC tank circuits. The cross-coupled transistors provide a negative resistance which, in turn, increases the Q of the on-chip spiral inductors, as will be appreciated by the skilled artisan.

Figure 5:
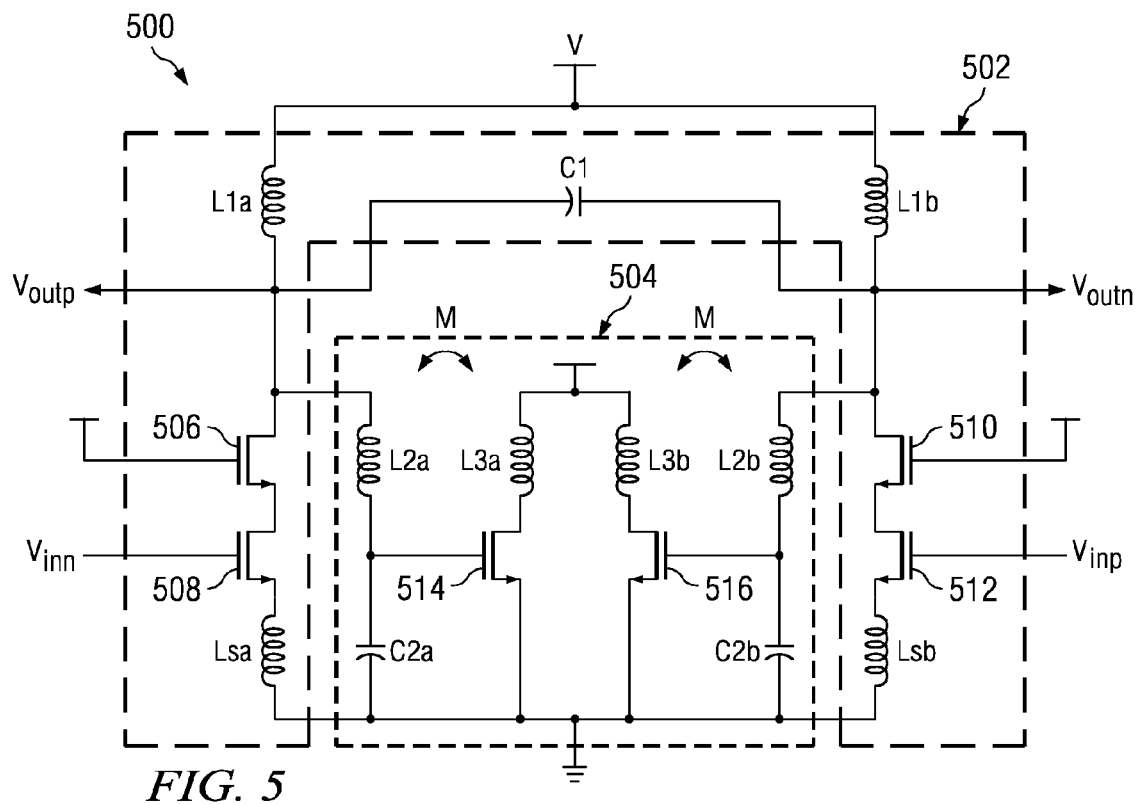
FIG. 5 illustrates an exemplary circuit in accordance with one embodiment.

FIG. 5 illustrates another exemplary circuit in accordance with one embodiment, generally at 500. In this example, circuit 500 is a double ended version that includes a low noise amplifier 502 whose output is coupled to an LC tank circuit 504.

In this example, a first end of the low noise amplifier 502 includes a pair of field effect transistors 506, 508. Transistor 506 is connected between output voutp and transistor 508 which has its gate connected to vinn. Here, vinn and voutp represent, respectively, the negative portion of the input signal for a receiver of a WCDMA system receiver and the amplified positive portion of the output signal for the WCDMA system. Transistor 506 is also connected to an inductor L1a which is tied to voltage V. Transistor 508 is connected to ground through an inductor Lsa which is used to tune the amplifier.

A second end of the low noise amplifier 502 includes a pair of field effect transistors 510, 512. Transistor 510 is connected between output voutn and transistor 512 which has its gate connected to vinp. Here, vinp and voutn represent, respectively, the positive portion of the input signal for a receiver of a WCDMA system receiver and the amplified negative portion of the output signal for the WCDMA system. Transistor 510 is also connected to an inductor L1b which is tied to voltage V. Transistor 512 is connected to ground through an inductor Lsb which is used to tune the amplifier.

In this embodiment, a capacitor C1 is connected between the negative and positive portions of the amplified output signal.

In addition, LC tank circuit 504 is connected between the output of the low noise amplifier 502 and ground. In this example, the LC tank circuit includes a pair of on-chip spiral inductors L2a and L2b, each of which is serially connected to a capacitor C2a, C2b respectively. Each capacitor is connected to ground. In this embodiment, the Q of the on-chip spiral inductor is low in comparison to where it should desirably occur.

To address this situation, the circuit is Q-enhanced by virtue of a pair of coupled inductors. Specifically, inductor L3a is coupled with inductor L2a of the tank circuit, and inductor L3b is coupled with inductor L2b of the tank circuit. Field effect transistors 514, 516 are provided and here, transistor 514 is connected between ground and inductor L3a and has its gate connected between capacitor C2a and inductor L2a of the tank circuit. Likewise, transistor 516 is connected between ground and inductor L3b and has its gate connected between capacitor C2b and inductor L2b.

Collectively, transistor 514, 516 and inductors L3a and L3b provide a negative resistance which, in turn, increases the Q of the on-chip spiral inductors, as will be appreciated by the skilled artisan.

Other Q-enhancement techniques can be used to provide the negative resistance without departing from the spirit and scope of the claimed subject matter. Using Q-enhancement, the transmission rejection can be higher than that which is achieved using bond wire inductors with Qs of around 25.

Figure 6:
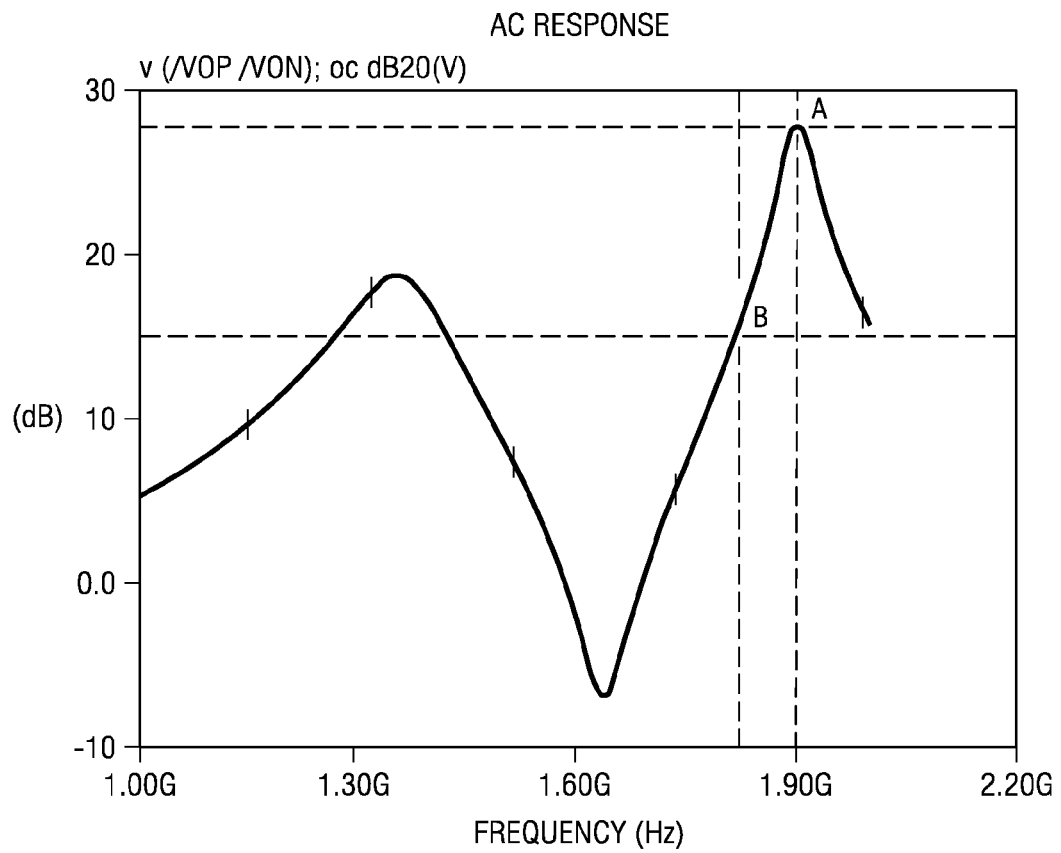
FIG. 6 illustrates the frequency response of a low noise amplifier using an embedded filter embodied as an on-chip coupled inductor Q-enhanced spiral inductor.

FIG. 6 illustrates the frequency response of the low noise amplifier using an embedded filter embodied as an on-chip coupled inductor Q-enhanced spiral inductor. Notice here that the gain is around 28 dB.

Exemplary Operating Environment

Figure 7:
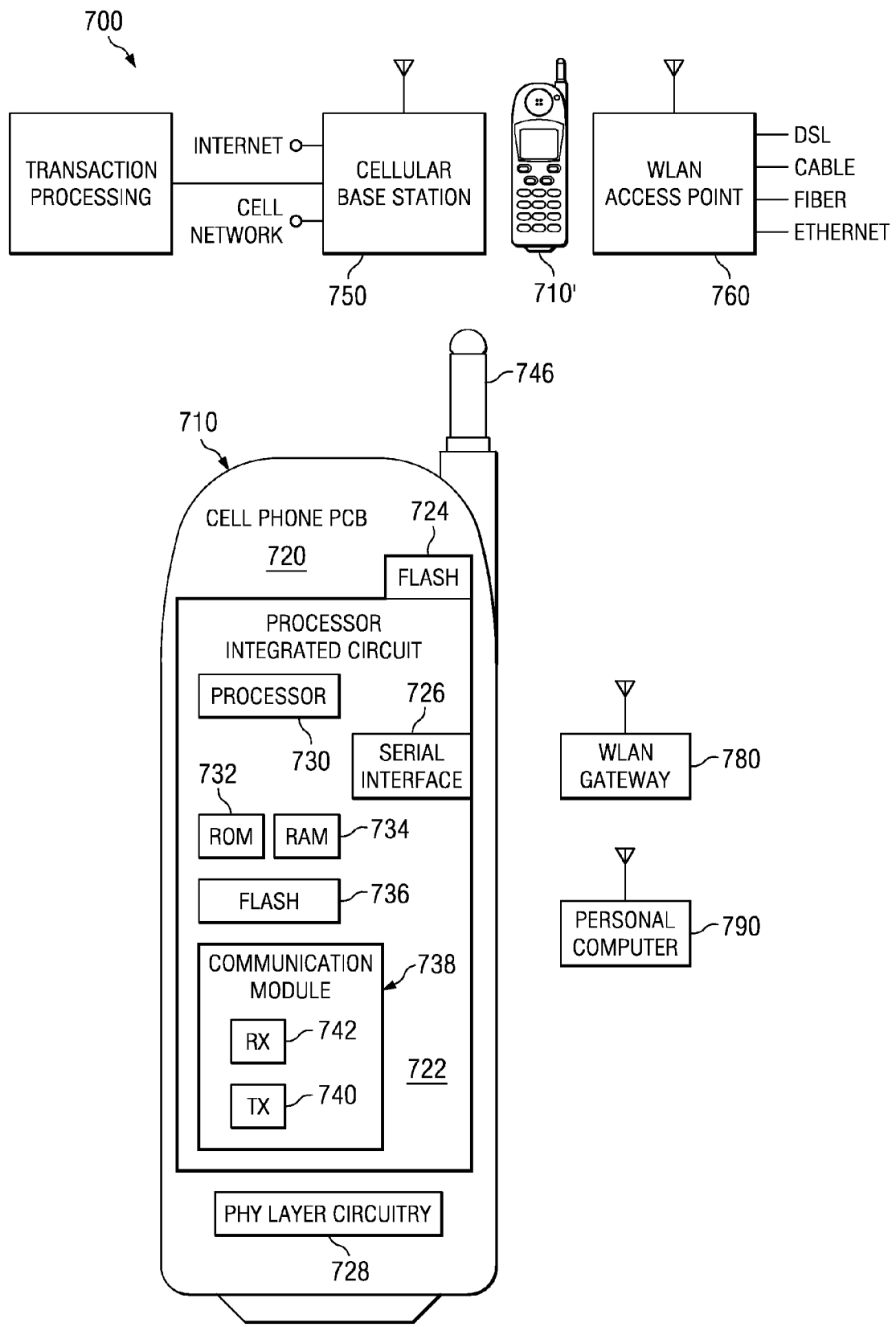
FIG. 7 is an exemplary communication system in accordance with one embodiment.

FIG. 7 illustrates a communications system 700 in which the inventive embodiments can be utilized in accordance with one embodiment. The various embodiments described above can be used in full-duplex systems as well as half-duplex systems. In half-duplex systems, the embodiments can be used in test modes where the transmitter and receiver are simultaneously turned on. Any or all of the system blocks, such as cellular telephone and data handsets 710 and 710', a cellular (telephony and data) base station 750, a WLAN AP (wireless local area network access point, IEEE 802.11 or otherwise) 760, a WLAN gateway 780, and a personal computer (PC) 790, communicate with each other in communications system 700. Each of the system blocks 710, 710', 750, 760, 780, 790 are provided with one or more PHY physical layer blocks and interfaces for DSL (digital subscriber line broadband over twisted pair copper infrastructure), cable (DOCSIS and other forms of coaxial cable broadband communications), fiber (fiber optic cable to premises), and/or Ethernet wideband network. Cellular base station 750 two-way communicates with the handsets 710, 710', and with the Internet, with cellular communications networks and with PSTN (public switched telephone network).

In this way advanced networking capability for services and content, such as cellular telephony and data, audio, music, voice, video, e-mail, e-commerce, file transfer and other data services, internet, world wide web browsing, TCP/IP (transmission control protocol/Internet protocol), voice over packet and voice over Internet protocol (VoP/VoIP), and other services are provided. The embodiments, applications and system blocks disclosed herein can be suitably implemented in fixed, portable, mobile, automotive, seaborne, and airborne, communications, control, and other apparatus.

Handset 710 is interoperable and able to communicate with all other system blocks of communications system 700. In accordance with one embodiment, cell phone 710 includes a cell phone printed circuit board (PCB) 720, a processor integrated circuit 722, an external flash memory 724, and a serial interface 726. Serial interface 726 is suitably a wireline interface, such as a USB interface connected by a USB line to the personal computer 790 when the user desires and for reception of software intercommunication and updating of information between the personal computer 790 (or other originating sources external to the handset 710) and the handset 710. Such intercommunication and updating also occur via a lower-security processor such as for cellular modem, WLAN, Bluetooth, or other wireless or wireline modem processor and physical layer (PHY) circuitry 728.

Processor integrated circuit 722 includes at least one processor (or central processing unit CPU) block 730 coupled to an internal (on-chip read-only memory) ROM 732, an internal (on-chip random access memory) RAM 734, and an internal (on-chip) flash memory 736. In addition, cell phone 710 includes a communication module 738 and includes a transmitter 740 and a receiver 742. In at least some embodiments, the transmitter and receiver 740, 742 are configured to communicate in connection with WCDMA FDD techniques, as will be appreciated by the skilled artisan. In addition, communication module can include the inventive low noise filter with LC tank circuit as described above. In operation, cell phone 710 includes an antenna 746 which is operably coupled with the communication module 738 to permit communication, as will be appreciated by the skilled artisan.

It will be noted that the words "internal" and "external" as applied to a circuit or chip respectively refer to being on-chip or off-chip of the processor chip 722. All items are assumed to be internal to an apparatus (such as a handset, base station, access point, gateway, PC, or other apparatus) except where the words "external to" are used with the name of the apparatus, such as "external to the handset."

It is to be appreciated and understood that, independent of the applications to which the above embodiments are put—whether half or full duplex systems, the inventive embodiments show how to construct a low noise amplifier with an arbitrary transfer function by connecting the differential output of transistor devices—here NMOS devices—to drive a complex load.

Exemplary Method

Figure 8:
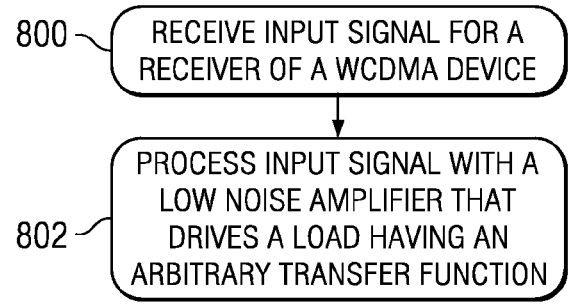
FIG. 8 is a flow diagram that describes steps in a method in accordance with one embodiment.

FIG. 8 is a flow diagram that describes steps in a method in accordance with one embodiment. The method can be implemented in connection with any suitable hardware, software, firmware, or combination thereof. In one embodiment, the method can be implemented by a suitably configured wireless communication unit, such as the one described above.

Step 800 receives an input signal for a receiver of a WCDMA device. Examples of how this can be done are described above. Step 802 processes the input signal with a low noise amplifier that drives a load having an arbitrary transfer function. This load can be provided, at least in part, by an embedded filter that is constructed using passive and/or active devices to create the arbitrary transfer function which can support selective Q-enhancement of poles or zeros. Exemplary circuits that can be utilized to perform this step are described above.

It is to be appreciated and understood that the circuitry of the complex load described above can be programmable so as to provide a programmable complex load that is reconfigurable. Hence, the complex load can be digitally controlled under the influence of a microprocessor running software. Upon detecting the need to re-program, the microprocessor can turn the Q-enhancement of some poles on or off. The microprocessor can also cause the transfer function to change by switching off poles and/or zeros by turning on or off components that constitute the load. Accordingly, the various capacitors and inductors that are used can be constructed such that their values are programmable. For example, the capacitors can be constructed using varactors that can be turned on or off. Hence, the transfer function of the complex load driven by the input transistors of the low noise amplifier can be reprogrammed under the control of the software. Further, certain poles and/or zeros can be adjusted to be within a predetermined range by operating tuning algorithms under digital control that changes the values of the specific components by processing the output of the receiver. Any optimization algorithm may be employed that separates the desired information from the output of the A/D converter of the receiver and selects appropriate values for specific components in the complex load of the low noise amplifier.

CONCLUSION

The various embodiments described above can eliminate the use of an external SAW filter by utilizing a low noise amplifier with an embedded filter that can filter out unwanted blockers or images. In accordance with at least some embodiments, the embedded filter provides a complex load to transistors in the low noise amplifier. The complex load can be constructed using passive and/or active devices and creates an arbitrary transfer function that supports selective Q-enhancement of poles or zeros. One particular implementation of the embedded filter is in the form of an LC tank circuit. The LC tank circuit is operably coupled to the output of the low noise amplifier and creates a transfer function whose poles and zeros can be selected to reject transmitter leakage, while maintain a desirable gain at the frequency of operation.

The above-described methods and devices support various platforms using a particular remote protocol at a client device. Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. A circuit system comprising:
a low noise amplifier having an input and an output, the input being configured to be connected to a receiver input signal; and
a complex load driven by the low noise amplifier, wherein the complex load provides an arbitrary transfer function with multiple poles and zeros, wherein the complex load is provided by two LC tank circuits having a transfer function that is configured to reject unwanted signals and maintain the gain of the amplifier, wherein at least one of the LC tank circuits employs on-chip spiral inductors.

2. A circuit system comprising:
a low noise amplifier having an input and an output, the input being configured to be connected to a receiver input signal; and
a complex load driven by the low noise amplifier, wherein the complex load provides an arbitrary transfer function with multiple poles and zeros, wherein the complex load is provided by two LC tank circuits having a transfer function that is configured to reject unwanted signals and maintain the gain of the amplifier, wherein at least one of the LC tank circuits employs on-chip spiral inductors, and wherein said at least one LC tank circuit is coupled to a negative resistance component to enhance the quality factor (Q) of the circuit system.

3. A circuit system comprising:
a low noise amplifier having an input and an output, the input being confirm to be connected to a receiver input signal; and
a complex load driven by the low noise amplifier, wherein the complex load provides an arbitrary transfer function with multiple poles and zeros, wherein:
the complex load is provided by two LC tank circuits having a transfer function that is configured to reject unwanted signals and maintain the gain of the amplifier;
at least one of the LC tank circuits employs on-chip spiral inductors;
said at least one LC tank circuit being coupled to a negative resistance component to enhance the quality factor (Q) of the circuit system; and
the negative resistance component comprises a pair of cross-coupled field effect transistors.

4. A circuit system comprising:
a low noise amplifier having an input and an output, the input being configured to be connected to a receiver input signal; and
a complex load driven by the low noise amplifier, wherein the complex load provides an arbitrary transfer function with multiple poles and zeros, wherein:
the complex load is provided by two LC tank circuits having a transfer function that is configured to reject unwanted signals and maintain the gain of the amplifier;
wherein at least one of the LC tank circuits employs on-chip spiral inductors;
said at least one LC tank circuit being coupled to a negative resistance component to enhance the quality factor (0) of the circuit system; and
the negative resistance component comprises coupled inductors.

5. A wireless communication unit comprising:
an antenna;
a processor operably coupled to the antenna;
an on-chip communication module operably coupled to the processor and having a transmitter and a receiver;
an on-chip low noise amplifier having an input and an output, the input being configured to be connected to a WCDMA input of the receiver; and
an on-chip complex load driven by the low noise amplifier, wherein the complex load provides an arbitrary transfer function with multiple poles and zeros, wherein the complex load is provided by a parallel combination of an inductor and a capacitor, followed by a series connection of an inductor and a capacitor.

6. A wireless communication method comprising:
receiving an input signal for a receiver of a WCDMA device; and
processing the input signal with a low noise amplifier that drives a programmable complex load, wherein the programmable complex loads provides an arbitrary transfer function with multiple poles and zeros, wherein the programmable complex load is provided by an LC tank circuit that employs spiral inductors.

7. A wireless communication method comprising:
receiving an input signal for receiver of a WCDMA device; and
processing the input signal with a low noise amplifier that drives a programmable complex load, wherein the programmable complex load provides an arbitrary transfer function with multiple poles and zeros, wherein the programmable complex load is provided by an LC tank circuit that employs spiral inductors, and wherein the LC tank circuit is coupled to a negative resistance component to enhance the quality factor (Q) of a circuit of which the LC tank circuit comprises a part.

8. The method of claim 7, wherein the negative resistance component comprises a pair of cross-coupled field effect transistors.

9. The method of claim 7, wherein the negative resistance component comprises coupled inductors.

* * * * *